United States Patent [19]

Prentice

[11] 4,115,655
[45] Sep. 19, 1978

[54] ELECTROMAGNETIC INTERFERENCE SHIELDING DEVICE

[75] Inventor: Leon Austin Prentice, Portland, Oreg.

[73] Assignee: Tektronix, Inc., Beaverton, Oreg.

[21] Appl. No.: 743,014

[22] Filed: Nov. 18, 1976

[51] Int. Cl.$^2$ .............................................. H05K 9/00
[52] U.S. Cl. .................................. 174/35 R; 52/773; 220/80; 339/95 R; 403/405; 428/573
[58] Field of Search .......... 174/35 R, 35 GC, 35 MS; 339/95 R; 428/571, 572, 573, 574, 575, 603; 403/405; 220/80; 52/501, 502; 16/DIG. 6; 200/159 R, 340

[56] References Cited

U.S. PATENT DOCUMENTS

| 26,208 | 5/1867 | Tupper | 339/97 R |
|---|---|---|---|
| 2,604,507 | 7/1952 | Tyson | 174/35 GC |
| 2,872,139 | 2/1959 | Bedford | 174/35.5 |
| 3,366,918 | 1/1968 | Johnson et al. | 174/35 GC |

Primary Examiner—J. V. Truhe
Assistant Examiner—J. H. Bouchard
Attorney, Agent, or Firm—Adrian J. La Rue

[57] ABSTRACT

An electromagnetic interference (EMI) shielding device for use in supporting members that receive enclosure covers of electrical or electronic instruments. The EMI device comprises a strip of metal having first spring means including first contact means which contain the device in position in a groove in the supporting member and provide electrical contact therewith and second spring means against which an edge of an enclosure member disposed in the groove engages thereby providing electrical contact therewith and securely maintaining the enclosure member in position.

5 Claims, 4 Drawing Figures

ELECTROMAGNETIC INTERFERENCE SHIELDING DEVICE

BACKGROUND OF THE INVENTION

Electronic and electrical cabinets and enclosures are being constructed to enable them to be manufactured economically as well as to enable them to be constructed as monolithic cabinets or to be interlocked for purposes of forming them into racks and stacks. It is important, especially in high frequency applications, that the supporting members in which the edges of enclosure members are received be provided with electromagnetic interference shielding means that will provide electrical contact between the supporting members and the closure members to prevent outside signals from interfering with the electronic circuitry contained within the cabinet and to prevent signals occurring within the cabinet from interfering with electronic circuitry in adjacent cabinets or locations. It is also important to secure the enclosure members in position within the support members so that they will not rattle.

SUMMARY OF THE INVENTION

The present invention relates to shielding devices and more particularly to electromagnetic interference shielding devices.

An object of the present invention is to provide an electromagnetic interference shielding device for disposition within groove means of a support member.

Another object of the present invention is the provision of an electromagnetic interference shielding device which has spaced spring contact means for securing the shielding device in position in groove means of a support member.

A further object of the present invention is to provide an electromagnetic interference shielding device which has spaced spring contact means for electrical contact with edge means of enclosure means.

An additional object of the present invention is the provision of an electromagnetic interference shielding device having first spring contact means for making electrical contact with surface means of groove means in a support member and second spring contact means for making electrical contact with edge means of closure means to be positioned in the groove means.

A still further object of the present invention is to provide an electromagnetic interference shielding device that will make electrical contact with a support member and an enclosure member and will maintain the enclosure member in position without rattling.

Still another object of the present invention is the provision of electromagnetic interference shielding means having spring contact means for scoring surfaces of a support means to which it is to be secured to make electrical contact therewith and for securing said shielding means in position thereon.

BRIEF DESCRIPTION OF THE DRAWINGS

Other objects of the present invention will be apparent from the following detailed description of a preferred embodiment thereof and the attached drawings of which.

DETAILED DESCRIPTION OF THE INVENTION

Figure 1:
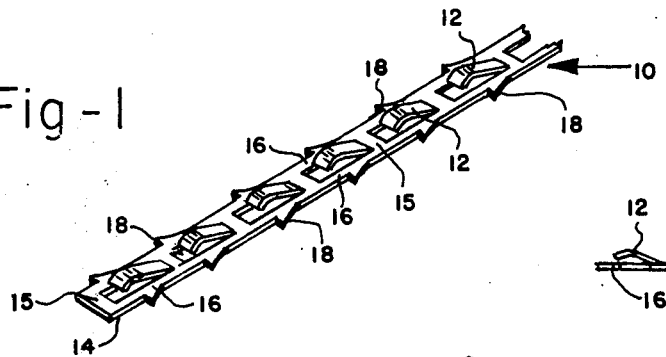
FIG. 1 is a part perspective view of an electromagnetic interference shielding device.
Figure 2:
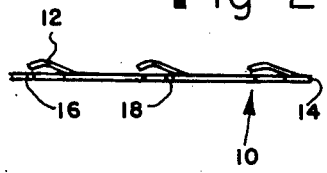
FIG. 2 is a side elevational view of part of the device of FIG. 1.
Figure 3:
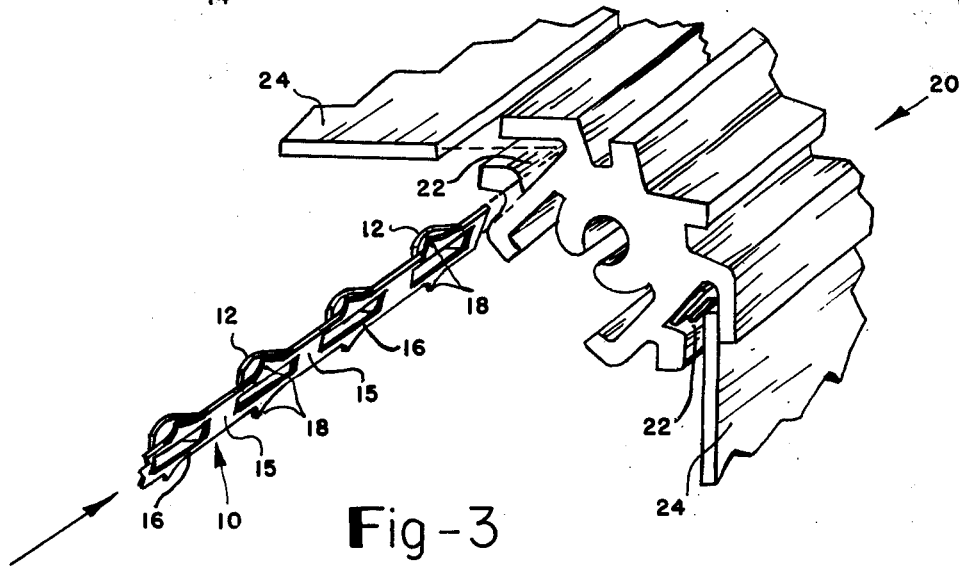
FIG. 3 is an exploded perspective view with parts broken away showing a support member, closure members and electromagnetic interference shielding device.
Figure 4:
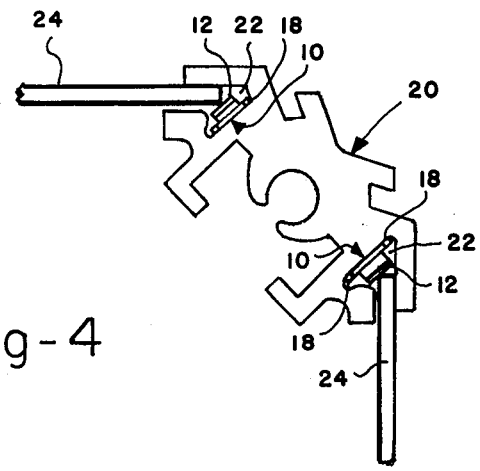
FIG. 4 is a front elevational view showing the parts of FIG. 3 in position.

Referring to FIG. 1, an electromagnetic interference shielding device 10 is a planar strip of metal which is preferably beryllium nickel that can be stamped and formed in accordance with conventional metal stamping techniques, does not have to be plated, has excellent spring characteristics, has excellent anti-corrosive characteristics and provides excellent electrical contact. Other metals can be used if desired so long as they have the requisite spring, anti-corrosive and electrical contact characteristics such as; e.g., beryllium, copper, spring brass, stainless steel, etc.

EMI shielding device 10 is provided with spring contact members 12 which are in the form of cantilever springs that have been stamped and formed out of metal strip 14. The stamping and forming of spring contact members 12 out of strip 14 leaves side members 16 which are also spring members and cross members 15. Each of side members 16 contains contact members 18 extending outwardly therefrom and having a wedge-shaped configuration defining a barb. As can be discerned, the beveled surfaces of contact members 18 are directed toward the end of contact members 12 that are anchored onto cross sections 15 of metal strip 14 and the straight surfaces of contact members 18 are disposed at about the midpoint of each respective contact member 12 which constitutes the arcuate contact-engaging section of contact member 12.

Support member 20, which is disclosed in pending U.S. patent application Ser. No. 743,016 filed Nov. 18, 1976, is provided with grooves 22 in which EMI shielding devices 10 are contained. EMI shielding devices 10 are inserted into respective grooves 22 of support member 20 in the direction that the beveled surface of contact members 18 face which facilitates the movement of devices 10 along grooves 22. The width across contact members 18 on opposing side members 16 is greater than the greatest width of grooves. As devices 10 are moved along grooves 22, the pointed sections of contact members 18 which are formed by the intersection of the beveled and straight surfaces thereof, score the surfaces of grooves 22 they engage thereby breaking through any oxide coating that may be present on contact members 18 and the groove surfaces which will result in excellent electrical contact. Contact members 18 will also maintain device 10 in position by virtue of the pressure exerted by spring side members 16.

Once devices 10 are positioned in grooves 22, closures members 24 are moved along grooves 22 in engagement with contact members 12 and in the direction that cantilever spring contact members 12 are directed. The movement of closure members 24 along grooves 22 in engagement with spring contact members 12 enables closure members 24 and contact members 12 to wipingly engage each other thereby breaking down any oxide coatings thereon so that excellent electrical contact is made therebetween. The spring contact members 12 also keep closure members 24 from rattling.

The spacing of the electrical contact members will be uniform and in accordance with the desired attenuation that will be involved. It is possible the support members and closure members will be made of plastic that has a metal coating thereon, and, if this is the case, the EMI shielding device will perform the same functions as if all metal members were being used.

The configuration of EMI shielding device 10 facilitates installation into the grooves of the support member at a minimum cost and the cost of manufacture of such shielding device is also economical. The shielding against emissive and susceptibility interference by use of EMI shielding gasket 10 is most effective.

While a preferred embodiment of the present invention has been illustrated and described, it will be apparent that changes and modifications may be made to this invention without departing therefrom in its broadest aspects. The appended claims therefore cover all such changes and modifications as fall therewithin.

The invention is claimed in accordance with the following:

1. An electronic cabinet having supporting members provided with groove means extending along the lengths thereof, metal closure means having their edge means positioned within the groove means, the improvement comprising:

an electromagnetic interference shielding means which includes a substantially planar strip of metal having first contact means extending outwardly from each side of said strip and being located at spaced locations along said strip, said first contact means being located in the plane of said planar strip, the width of said strip across said first contact means being slightly wider than the groove means along which said strip is disposed so that said first contact means scores the surfaces of the groove means as said strip is moved along the groove means thereby breaking down any oxide coating on said first contact means and the surfaces of the groove means and making connection therewith, said strip extending along substantially the entire length of the groove means; and second contact means provided by said strip extending outwardly from the plane of said planar strip engaging the edge means of the closure means that are disposed within the groove means.

2. The combination according to claim 1 wherein said first contact means define spring members having wedged-shaped contact members extending outwardly therefrom.

3. The combination according to claim 2 wherein said wedge-shaped contact members have beveled surfaces to enable said strip to be moved along the groove means in one direction and straight surfaces to prevent said strip from being moved in an opposite direction when the edge means of the closure means moves along said second contact means.

4. The combination according to claim 1 wherein said second contact means define cantilever spring members having an arcuate configuration.

5. The combination according to claim 1 wherein said first contact means comprise spring members having barbed contact members extending outwardly therefrom and said second contact means comprise cantilever spring members having an arcuate contact-engaging section, said barbed contact members being positioned about the midpoint of the respective ones of said cantilever spring members.

* * * * *